United States Patent [19]

Otsuka et al.

[11] Patent Number: 5,401,604
[45] Date of Patent: Mar. 28, 1995

[54] POSITIVE-TYPE PHOTOSENSITIVE RESIN COMPOSITIONS WITH QUINONE DIAZIDE SULFONYL UNIT

[75] Inventors: Chikayuki Otsuka, Kadoma; Mamoru Seio, Takatsuki; Kiyomi Sakurai, Yawata; Kazuyuki Kawamura, Nara, all of Japan

[73] Assignee: Nippon Paint Co., Ltd., Osaka, Japan

[21] Appl. No.: 188,712

[22] Filed: Jan. 31, 1994

[30] Foreign Application Priority Data

Jan. 29, 1993 [JP] Japan .................................. 5-013412
Apr. 23, 1993 [JP] Japan .................................. 5-097530

[51] Int. Cl.6 .............................................. G03F 7/023
[52] U.S. Cl. ...................................... 430/190; 430/165; 430/168; 430/169; 430/191; 430/192; 430/193
[58] Field of Search ............... 430/190, 191, 192, 193, 430/165, 168, 169

[56] References Cited

U.S. PATENT DOCUMENTS 4,999,274  3/1991  Seio et al. ........................... 430/190
5,055,374 10/1991  Seio et al. ........................... 430/190

FOREIGN PATENT DOCUMENTS 0302941 2/1989 European Pat. Off. ............ 430/192
0354018 2/1990 European Pat. Off. ............ 430/192

*Primary Examiner*—Charles L. Bowers, Jr.
*Assistant Examiner*—Christopher G. Young
*Attorney, Agent, or Firm*—Wenderoth, Lind & Ponack

[57] ABSTRACT

A positive-type photosensitive resin composition containing a resin which results from reactions between a specific polyepoxide compound, a carboxylic acid compound having a specific phenolic hydroxyl group, a carboxylic acid compound having no specific phenolic hydroxyl group, and 1,2-quinone diazide sulfonyl halide. The resin composition has high exposure sensitivity, is capable of inhibiting swell or dissolution of unexposed areas during the stage of development, and yet retains other favorable properties. The resin composition has also attained short developing time.

3 Claims, No Drawings

POSITIVE-TYPE PHOTOSENSITIVE RESIN COMPOSITIONS WITH QUINONE DIAZIDE SULFONYL UNIT

BACKGROUND OF THE INVENTION

1. Field of the Invention

The present invention relates to a positive-type photosensitive resin composition which is useful for use as a microfine processing resist in the fabrication of printed-wiring boards, integrated circuits, and the like, as well as for use as a photosensitive material in the manufacture of lithographic plates.

2. Description of the Prior Art

Hitherto, positive-type photosensitive resin compositions have been widely used in manufacturing integrated circuits, printed wiring boards, and printing plates. Photosensitive resin compositions capable of forming a positive image have been used which are of the type comprising an alkali-soluble novolak resin mixed with a quinone diazide compound. In such a system, the quinone diazide compound is soluble in an organic solvent only and not soluble in an aqueous solution of alkali, which characteristic is utilized in such a way that the compound is present within the system as a dissolution inhibitor against the developing solution which is an aqueous solution of alkali. When the compound is subjected to ultraviolet light irradiation, the quinone diazide group therein is decomposed to produce a carboxylic acid radical via ketene, which is soluble in the aqueous solution of alkali, and this facilitates development.

However, in such a system, the composition involves some brittleness when it is made into a resist film. Another problem is that the composition is not found very satisfactory in its contact behavior relative to the substrate. As such, there exists a need for improvement.

The present inventors already proposed a composition which is produced from a combination of a polyepoxide compound, a compound having a phenolic hydroxyl group, and a quinone diazidic acid halide, by causing all these substances to react with each other (U.S. Pat. No. 4,999,274). In such a system, the quinone diazidic photosensitive component itself has good film-forming properties, good flexibility, good adhesiveness relative to the substrate, and good solubility in alkali after exposure to light, and further it is highly compatible with an alkali-soluble resin.

The present inventors made an attempt at further improving the exposure sensitivity of the composition. As a result of their study, it was found that an improvement in the exposure sensitivity, that is, an improvement in the solubility of the composition after exposure to light could be achieved by controlling an addition rate of a naphthoquinone diazide acid halide, which is highly hydrophobic, to a low rate. In this case, however, the affinity of the unexposed area or printing area for the developing solution is increased, so that the function of the positive-type photosensitive material as a dissolution inhibitor is lost, which fact is likely to lead to the trouble of swelling or partial dissolution during the stage of development. This tells that exposure sensitivity improvement and resistance to swelling or dissolution are factors incompatible with each other.

SUMMARY OF THE INVENTION

Accordingly, the object of the present invention is to provide a positive-type photosensitive resin composition having good flexibility and good adhesive property, and which has high exposure sensitivity and will prove exceedingly useful if possible swelling and/or dissolution of any unexposed portion is reasonably inhibited.

According to the present invention, this object can be accomplished by a positive type photosensitive resin composition comprising a reaction product of the following four components:

(A) at least one kind of polyepoxide compound having an epoxy equivalent of 75 to 1000 selected from the group consisting of polyvalent alcohol glycidyl ether compounds, glycidyl ester compounds of polycarboxylic acid, alicyclic glycidyl compounds, glycidyl amine compounds, heterocyclic glycidyl compounds, and alkylene oxide compounds of bisphenol A;

(B) an aromatic or heterocyclic carboxylic acid compound having a phenolic hydroxyl group expressed by the general formula (I):

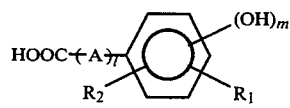

(in which A represents an alkylene or arylene which may have a substituent, or $-CH=CH-$, $-CO-R_3-$, $-CO-O-R_4-$, $-CO-CH_2NH-$, where $R_3$, $R_4$ represent an alkylene or arylene group which may have a substituent; l represents 0 or 1; m represents an integer of 1 to 3; $R_1$, $R_2$ may be same or different and represent a hydrogen atom, a halogen atom, an alkyl group, an alkenyl group, a nitrile group, or an alkoxy group; and $R_1$, $R_2$, together with the carbon atom of a benzene ring, may form an aromatic ring, an alicyclic ring, or a heterocyclic ring);

(C) either an aromatic or heterocyclic carboxylic acid compound having no phenolic hydroxyl group which is expressed by the general formula (II):

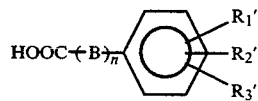

(in which B represents an alkylene or arylene which may have a substituent, or $-CH=CH-$, $-CO-R'_4-$, $-CO-O-R'_5-$, $-CO-CH_2NH-$, where $R'_4$, $R'_5$ represent an alkylene or arylene group which may have a substituent; n represents 0 or 1; $R'_1$, $R'_2$, $R'_3$ may be same or different and represent a hydrogen atom, a halogen atom, an alkyl group, an alkenyl group, a nitrile group, or an alkoxy group; and $R'_1$, $R'_2$, $R'_3$, together with adjacent substituents and the carbon atom of a benzene ring, may form an aromatic ring, an alicyclic ring, or a heterocyclic ring), or a saturated or unsaturated aliphatic monocarboxylic acid compound represented by the general formula (III):

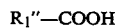

(in which $R_1''$ represents an alkyl, alkenyl or alkoxy group which may have a substituent, a hydrogen atom, $R_2''-O-CO-R_3''-$, $R_4''-NH-CO-R_5''-$, where $R_2''$ and $R_4''$ represent an alkyl, alkenyl or monoalkoxyalkyl group which may have a substituent, and $R_3''$ and $R_5''$ represent an alkylene, alkylene ether or —CH=CH— which may have a substituent) or the both; and (D) 1,2-quinone diazide sulfonyl halide; wherein the ratio of (B) to (C), both carboxylic acid components, is such that the proportion of (C) is 10% at minimum and 95% at maximum in terms of carboxyl group equivalent, and the ratio of (B)+(C) carboxyl group: (A) epoxy equivalent=1:0.8 to 1.2, and wherein as a result of the reaction between the phenolic hydroxyl group of (B) and the sulfonyl halide of (D), the number of unreacted phenolic OH groups remaining in one molecule is equivalent to 0 to 75% of the number of phenolic OH groups present in one molecule prior to the reaction.

DETAILED DESCRIPTION OF THE INVENTION

The photo-sensitive resin composition in accordance with the present invention can be easily produced by carrying out reaction between:

(A) at least one kind of polyepoxide compound having an epoxy equivalent of 75 to 1000 selected from the group consisting of glycidyl ether compounds of polyhydroxy alcohol, glycidyl ester compounds of polycarboxylic acid, alicyclic glycidyl compounds, heterocyclic glycidyl compounds, and alkylene oxide compounds of bisphenol A;

(B) an aromatic or heterocyclic carboxylic acid compound having a phenolic hydroxyl group expressed by the general formula (I); and (C) either an aromatic or heterocyclic carboxylic acid compound having no phenolic hydroxyl group which is expressed by the general formula (II) or a saturated or unsaturate monocaroxylic acid compound which is expressed by the general formul (III), or the both, in such a way that with respect to the (B) and (C) components, the proportion of the (C) component comes within the range of 10 to 95% in terms of carboxyl group equivalent and the condition of (the sum of carboxyl group equivalents of the (B) and (C) components):(the epoxy group equivalent)=1:0.8 to 1.2 is met, and then by causing the (D) component, 1,2-quinone diazide acid halide to react with the resulting reaction product in the equivalent ratio of 1:0.25 to 1.0 relative to the phenolic hydroxyl group of the (B) component. As an alternative, reaction may be carried out in such a way that 1,2-quinone diazide acid halide, the (D) component, is first caused to react with the aromatic or heterocyclic compound having a phenolic hydroxyl group, the (B) component, in prescribed proportions; and then the resulting reaction product, together with a predetermined proportion of the (C) component, is caused to react with the (A) component or polyepoxide compound. However, when the heat stability of the quinone diazide compound is considered, the former method is preferred.

It is to be noted that the term "polyepoxide compound" used herein means an epoxy compound having an average epoxy group number of 1.2 or more per molecule.

The polyepoxide compound used as (A) component in the present invention is at least one kind of compound having an epoxy equivalent of 75 to 1000, preferably 100 to 350, selected from the group consisting of glycidyl ether compounds of polyhydroxy alcohol, glycidyl ester compounds of polycarboxylic acid, alicyclic glycidyl compounds, heterocyclic glycidyl compounds, and alkylene oxide compounds of bisphenol A. If the epoxy equivalent of the compound is less than 75, the molecular weight of the compound is too low to provide any meaningful film forming property. If the epoxy equivalent is more than 1000, the molecular weight is excessively high and, therefore, the compound is hard to dissolve, which leads to lower positive-type light sensitivity.

More specifically, any of the following compounds may be used:

(a) glycidyl ether compounds of polyvalent alcohol, such as polyethylene glycol glycidyl ether, polypropylene glycol glycidyl ether, neopentyl glycol glycidyl ether, glycerine diglycidyl ether, trimethylol propane triglycidyl ether, and resorcin glycidyl ether;

(b) glycidyl ester compounds of polycarboxylic acid, such as diglycidyl phthalate, diglycidyl tetrahydrophthalate, diglycidyl adipate, and diglycidyl dimerate;

(c) alicyclic glycidyl compounds, such as hydrogenated-bisphenol A diglycidyl ether, cyclohexene derivative, and dicyclopentadiene derivative;

(d) glycidylamine compounds, such as tetraglycidyl-bisaminomethylcyclohexane and the like;

(e) heterocyclic glycidyl compounds, such as triglycidyl isocyanurate, and N,N-diglycidyl-5,5-dimethyl hydantoin; and (f) alkylene oxide compounds of bisphenol A, such as diglycidyl ether of an adduct of 2 mol of propylene oxide to bisphenol A, and the like.

Selective use of these polyepoxide compounds will provide for improvement in film flexibility, film adhesive characteristic, and resolution power.

The aromatic or heterocyclic carboxylic acid compound having a phenolic hydroxyl group used as (B) component in the present invention is expressed by the formula (I). In the formula, the alkyl group preferably has a carbon number of 1 to 20; the alkenyl group preferably has a carbon number of 2 to 10; the alkoxy group preferably has a carbon number of 1 to 20; the alkylene group preferably has a carbon number of 1 to 20; and the arylene group preferably has a carbon number of 6 to 20. Halogen atoms are specifically iodine, fluorine, chloride, and bromine. Examples of aromatic, alicyclic, and heterocyclic rings which are formed from $R_2$, $R_3$, and a benzene ring are 2-hydroxy-1-naphthalic acid, 8-hydroxyquinoline-7-carboxylic acid monohydride, and 4′, 5′-dibromofluorescein. As examples of such carboxylic acid compounds may be enumerated 3-methoxysalicylic acid, 3-methylsalicylic acid, 5-methylsalicylic acid, 5-tert-octylsalicylic acid, 3-chloro-4-hydroxybenzoic acid, 5-fluoro-3-hydroxybenzoic acid, 4-ethoxy-2-hydroxybenzoic acid, 5-methylthio-salicylic acid, 3-hydroxy-4-nitrobenzoic acid, 3,5-dimethyl-4-hydroxybenzoic acid, 1,5-di-tert-butyl-4-hydroxybenzoic acid, 3-phenylsalicylic acid, 4-benzamido-salicylic acid, 4-dimethylamino salicylic acid, 3,4-dihydroxybenzoic acid, 2,3-dihydroxybenzoic acid, 2,6-dihydroxybenzoic acid, 4-bromo-3,5-dihydroxybenzoic acid, 3,4,5-trihydroxybenzoic acid, 2,4,6-trihydroxybenzoic acid, dibromogarlic acid, o-hydroxyphenyl acetic acid, m-hydroxyphenyl acetic acid, m-hydroxyphenyl acetic acid, p-hydroxyphenyl acetic acid, 4-hydroxy-3-methoxyphenyl acetic acid, DL-4-hydroxy-3-methoxymandelic acid, p-hydroxyphenyl pyruvic acid, 3-(p-hydroxyphenyl)-lactic acid, DL-3,4-dihydroxymandelic acid, 3,4-dihydroxyphenyl acetic acid, o-hydroxycinnamic acid, m-hydroxycinnamic acid, p-hydroxycinnamic acid, 3-hydroxy-4-methoxycinnamic acid, 3,4-dihydroxycinnamic acid, 3,5-dimethoxy-4-hydroxycinnamic acid, 3,4-dihydroxy hydrocinnamic acid, N-(p-hydroxyphenyl) glycine, 3,5-iodotyrosine, and homogentisic acid.

As the component (C), either the aromatic or heterocyclic carboxylic acid compound represented by the general formula (II) or the saturated or unsaturated aliphatic monocarboxylic acid represented by the general formula (III), or the both can be employed. The use of the comound (III) effectively shortens develping time.

The aromatic or heterocyclic carboxylic acid compound having no phenolic hydroxyl group used as (C) component in the present invention is expressed by the formula (II). The carbon numbers and the like of the alkyl group and the like in the formula (II) are equivalent to those in the formula (I). Specifically, as examples of such compounds may be enumerated benzoic acid, phenylacetic acid, 3-phenylpropionic acid, 2-phenylpropionic acid, 4-phenylbutylic acid, 3-phenylbutylic acid, 2-phenylbutylic acid, 5-phenylvaleric acid, 4-phenylvaleric acid, phenoxyacetic acid, 3-phenoxypropionic acid, 2-phenoxyvaleric acid, 11-phenoxyundecanoic acid, benzoylformic acid, 3-benzoylpropionic acid, 4-benzoylbutylic acid, 5-benzoylvaleric acid, α-bromophenylacetic acid, dl-α-methoxy-α-trifluoromethoxyphenylacetic acid, thiophenoxy acetic acid, benzylmercaptoacetic acid, styrylacetic acid, trans-cinnamic acid, α-methylcinnamic acid, o-toluic acid, m-toluic acid, p-toluic acid, o-methoxybenzoic acid, m-methoxybenzoic acid, p-benzoic acid, o-ethoxybenzoic acid, p-ethoxybenzoic acid, o-nitrobenzoic acid, m-nitrobenzoic acid, p-nitrobenzoic acid, o-chlorobenzoic acid, m-chlorobenzoic acid, p-chlorobenzoic acid, o-acetylbenzoic acid, p-acetylbenzoic acid, 2-dimethylaminobenzoic acid, 3-dimethylaminobenzoic acid, 4-dimethylaminobenzoic acid, p-tert-butylbenzoic acid, o-(hexadecylthio)benzoic acid, α-p-bromo-p-toluic acid, 4-n-butoxybenzoic acid, p-dodecyloxybenzoic acid, 2-biphenylcarboxylic acid, α-phenyl-o-toluic acid, 2-bibenzylcarboxylic acid, o-phenoxybenzoic acid, N-phenylanthranilic acid, 2-(p-fluorobenzoyl)benzoic acid, 1-methylindene-2-carboxylic acid, 1-phenyl-1-cyclohexanecarboxylic acid, trans-2-phenyl cyclopropane-1-carboxylic acid, 1-phenylcyclopentanecarboxylic acid, 1-phenyl-1-cyclopentanecarboxylic acid, cyclohexylphenylacetic acid, diphenylacetic acid, triphenylacetic acid, hydrocinnamic acid, 2,2-diphenylpropionic acid, 3,3-diphenylpropionic acid, 2-phenylphthalic acid, 3-phenylphthalic acid, 4-phenylphthalic acid, 1-naphthenic acid, 3-nitro-1-naphthenic acid, 9-fluorenecarboxylic acid, 9-fluorene-4-carboxylic acid, anthrancene-9-carboxylic acid, xanthene-10-carboxylic acid, 2-methoxyphenylacetic acid, 3-methoxyphenylacetic acid, 4-methoxyphenylacetic acid, 3-(o-methoxyphenyl)-propionic acid, o-nitrophenylacetic acid, m-nitrophenylacetic acid, p-nitrophenylacetic acid, o-nitrophenoxyacetic acid, m-chlorophenylacetic acid, p-chlorophenylacetic acid, 2,6-dimethylbenzoic acid, 2,3-dimethylbenzoic acid, 2,6-dichlorobenzoic acid, 2,4-dichlorobenzoic acid, 3,4-dichlorobenzoic acid, 2,5-dichlorobenzoic acid, 2-methyl-6-nitrobenzoic acid, 3-methyl-6-nitrobenzoic acid, 4-methyl-3-nitrobenzoic acid, 3-methyl-4-nitrobenzoic acid, 2-methyl-5-nitrobenzoic acid, 2,3-dinitrobenzoic acid, 2,6-dinitrobenzoic acid, 2,4-dinitrobenzoic acid, 2,4-dimethoxybenzoic acid, 3,4-dimethoxybenzoic acid, piperonic acid, 4-methylthio-3-nitrobenzoic acid, 2,3-dichlorophenoxyacetic acid, 2,4-dichlorophenoxyacetic acid, 3,4-dichlorophenoxyacetic acid, α-(4-chloro-2-methylphenoxy)propionic acid, 4-ethoxy-3-methoxyphenylacetic acid, (3,4-dimethoxyphenyl)acetic acid, (2,5-dimethylphenyl)acetic acid, 3-(3,4-dimethoxyphenyl)propionic acid, 3,4-dichloro-α-methylmandelic acid, 1-naphthaleneacetic acid, 2-naphthaleneacetic acid, 2-naphthoxyacetic acid, di-p-tolylacetic acid, 4-fluorophenylacetic acid, 3-(p-fluorobenzoyl)propionic acid, Bis-(p-cyclophenyl)acetic acid, p-ethoxyphenylacetic acid, 2,4,6-trimethylbenzoic acid, 3,4,5-trimethoxybenzoic acid, 3,5-dinitro-o-toluic acid, 2-chloro-3,5-dinitrobenzoic acid, 4-dimethylamino-3,5-dinitrobenzoic acid and the like.

The saturated or unsaturated aliphatic monocarboxylic acid compound is represented by the general formula (III). In the general formula (III), the alkyl group preferably has 1 to 30 carbon atoms, and the alkenyl group preferably has 2 to 20 carbon atoms. The alkoxy group preferably has 1 to 20 carbon atoms and the monoalkoxyalkyl group preferably has 2 to 30 carbon atoms. Also, the alkylene group preferably has 1 to 20 carbon atoms and the alkylene ether group preferably has 2 to 20 carbon atoms. Typical examples of the monocarboxylic acid compounds (III) are formic acid, acetic acid, propionic acid, n-butyric acid, trimethylacetic acid, n-valeric acid, isovaleric acid, 2-methylbutyric acid, hexanoic acid, 2-methylvaleric acid, 2,2-dimethylbutyric acid, 2-ethyl-n-butyric acid, tert-butylbutyric acid, isocaproic acid, n-heptanoic acid, octanoic acid, 2-ethylhexanoic acid, n-nonanoic acid, tridecanoic acid, 3-pentyloctanoic acid, myristic acid, palmitic acid, heptadecanoic acid, 3-heptyldecanoic acid, stearic acid, isostearic acid, nonadecanoic acid, arachidic acid, 3-nonyldodecanoic acid, n-docosanoic acid, 2-decyldodecanoic acid, 3-undecyltetradodecanoic acid, 2-dodecyltetradecanoic acid, 3-tridecylhexadecanoic acid, 2-tetradecylhexadecanoic acid, triacontanoic acid, 2-hexadecyloctadecanoic acid, 2-octadecyleicosanoic acid, crotonic acid, 3-butenoic acid, allylacetic acid, tiglic acid, angelic acid, 3-methyl-2-butenoic acid, 6-heptenoic acid, trans-2-octenoic acid, trans-2-nonenoic acid, trans-2-decenoic acid, linolenic acid, 2-allyl-4-methyl-4-pentenoic acid, elaidic acid, oleic acid, methoxyacetic acid, ethoxyacetic acid, 3-ethoxypropionic acid, difluoroacetic acid, trifluoroacetic acid, heptafluorobutyric acid, pentadecafluorooctanoic acid, hexadecafluorononanoic acid, chlorodifluoroacetic acid, dichlorofluroacetic acid, trichloroacetic acid, bromoacetic acid, tribromoacetic acid, 2-chloropropionic acid, 2-bromopropionic acid, 3-chloropropionic acid, 3-bromopropionic acid, 2,3-dichloropropionic acid, 2,3-dibromopropionic acid, beta-chloropivalic acid, beta, beta-dichloropivalic acid, tris-(chloromethyl)-acetic acid, 2-bromobutyric acid, 3-chlorobutyric acid, 4-chlorobutyric acid, 5-chlorobutyric acid, 5-bromovalic acid, 6-bromohexanoic acid, 11-bromoundecanoic acid, trans-3-chlorocrotonic acid, cis-3-chlorocrotonic acid, DL-lactic acid, mercaptoacetic acid, 2-mercaptopropionic acid, 3-mercaptopropionic acid, thioacetic acid, 4-ethylthio)butyric acid, 2-ketobutyric acid, 2-ketodecanoic acid, revulinic acid, 4-acetoamideacrylic acid, 3-nitropropionic acid and the like.

The (B) and (C) components are caused to react with the polyoxide compound of the (A) component by being heated in a usual solvent to a temperature of 50° to 180° C., preferably 80° to 150° C., in the presence of a catalyst, provided that the proportion of the (C) component in the total of the (B) and (C) components is within the range of 10 to 95% in terms of carboxyl group equivalent and that (the sum of carboxyl group equivalents of the two components):(epoxy group equivalent)=1:0.1 to 1.2, preferably 1:0.9 to 1.1. The solvent may be ketones (such as, methyl ethyl ketone and methyl isobutyl ketone), ethers (such as, tetrahydrofuran, diethylene glycol dimethyl ether and dioxane), or the like, which will be used in a suitable proportion, for example, 5 to 500 parts by weight relative to 100 parts by weight of resin materials. For the catalyst, such known materials as tertiary amine compound, quaternary ammonium compound, imidazole compound, and inorganic alkali, which are useful as catalysts for reaction between epoxy and carboxylic groups, may be advantageously used within a concentration range of 0.001 to 5%.

In the present invention, it is essential that 0.8 to 1.2 equivalent of epoxy group be caused to react with one equivalent of carboxyl group. The reason is that if the epoxy group is less than 0.8 equivalent, an excessive number of free carboxyl groups will be present in the final resin, so that the solubility of the resin will become excessively great relative to an alkaline developing solution, which will adversely affect the resistance of an unexposed portion to the developing solution. On the other hand, if the epoxy group is more than 1.2 equivalent, crosslinking reactions will proceed between polyepoxide compounds, and thus the resin may have excessively high resistance to alkaline water, resulting in development failure even under sufficient light emission.

According to the invention, the reaction product of the polyepoxide compound with the (B) and (C) components is then reacted with the (D) component or 1,2-quinone diazide acid halide, such as 1,2-naphthoquinone diazide-4-sulfonyl chloride, 1,2-naphthoquinone-5-sulfonyl chloride, or 1,2-benzoquinone diazide-4-sulfonyl chloride, in which reaction the proportion of the (D) component is 0.25 to 1.00 equivalent relative to one equivalent of phenolic hydroxyl group. Usually, this reaction is conveniently carried out in a solvent, such as dioxane, acetone, tetrahydrofuran, or methylethyl ketone, in the presence of an inorganic alkali, such as sodium carbonate or sodium hydroxide, or an organic amine, such as diethylamine or triethylamine, in a temperature range of −20° to 50° C., preferably −10° to 30° C. Conditions for reaction may be suitably selected depending upon the material substances.

One feature of the positive type photosensitive resin composition according to the invention is that the (C) component is introduced into a resin skelton. The introduction of such a component into the resin skelton is advantageous in that as compared with the case in which reaction is effected only with the (B) component, the quantity of phenolic hydroxyl groups in molecules is reduced, which results in considerable improvement in the resistance of unexposed portions to the developing solution. That is, while the proportion of naphthoquinone diazide acid halide, a highly hydrophobic substance, is controlled to a relatively low level to provide for improved solubility after light irradiation, on one hand, the introduction of the (C) component provides for improved resistance of the unexposed area to the developing solution, on the other hand. In the invention, such conflicting features can be both consistently achieved. Therefore, if the proportion of the (C) component is less than 10%, it will have no effect for improvement in the resistance of unexposed areas to the developing solution. On the other hand, if the proportion of the (C) component is more than 95%, the addition of 1,2-quinone diazide acid halide is insignificant and accordingly any sufficient positive-type photosensitive performance cannot be achieved.

In the present invention, it is essential that the required equivalent ratio of phenolic hydroxyl group to 1,2-quinone diazide acid halide be met. If the proportion of 1,2-quinone diazide acid halide is lower than 0.25 equivalent, the alkali resistance of the unexposed portion is unfavorably low. On the other hand, if the proportion is higher than 1.0 equivalent, a quinone diazide acid compound of a small molecular weight will remain in the form of an impurity in the final resin composition, which makes it impossible to obtain a clear image and also will cause variations in film characteristics.

Resin compositions having such photosensitive groups have per se good film forming properties and have good flexibility and good adhesive performance relative to metals. Moreover, by selectively using polyepoxide compounds according to the composition of an alkali-soluble resin used as required, it is possible to obtain satisfactory compatibility of the two resin components and to provide for transparency with respect to the resulting mixed resin composition film.

In the present invention, the positive-type photosensitive resin composition may comprise only such photosensitive components and, even so, it can be used as a resin film by virtue of the good film forming and contacting properties of the components. However, it is desirable to use the resin composition in combination with an alkali-soluble resin. For this purpose, the two resin materials are dissolved in a suitable solvent and the resulting solution is coated on a substrate by means of a conventional coating means, such as a spinner coater, followed by drying, whereby a photosensitive layer can be formed. Examples of suitable solvents are glycol ethers, such as ethylene glycol monomethyl ether, ethylene glycol monoethyl ether, and ethylene glycol monobutyl ether; glycol ether acetates, such as ethylene glycol monomethyl ether acetate and ethylene glycol monoethyl ether acetate; aromatic hydrocarbons, such as toluene and xylene; ketones, such as methyl ethyl ketone and cyclohexanone; and acetic esters, such as ethyl acetate and butyl actate, which solvents may be used alone or in mixture. For use as a substrate is available any of the following materials, for example: silicon wafers, aluminum plates or sheets, plastic films, paper, glass, copper plated plates, and copper-clad laminated plates for printed circuit boards, which may be suitably used according to the intended purpose.

The positive-type photosensitive resin composition of the present invention may be mixed with a resin composition having salt-forming groups and a neutralizer for such salt-forming groups and dispersed in water, and can be advantageously used as a photosensitive resin composition for electrocoating purposes.

The process of electrocoating comprises immersing a substrate having an electroconductive surface in an electrocoating bath containing a water-soluble or water-dispersible photosensitive resin composition, and electrically conducting the substrate as a pole corresponding to a counter charge of the resulting photosensitive resin film to thereby deposit the resin film on the substrate. According to the electrocoating process, it is possible to form a film of uniform thickness on the surface of the substrate. Film thickness control can be easily performed by controlling the voltage to be applied and the time for voltage application. Further, the unevenness of the substrate surface and scars present thereon, if any, can be satisfactorily followed up. This provides an advantage that no special pretreatment with the substrate surface is unnecessary. Where the object being coated is a printed circuit board which usually has a small through-hole or via hole formed therein, the electrocoating liquid penetrates into the interior of the board to form a photosensitive resin coat so as to provide sufficient coating for protection against the subsequent process of etching.

The positive-type photosensitive resin composition of the present invention has no self-emulsifying characteristic per se and, therefore, in order that the composition may be made into an aqueous dispersion, it is necessary that the composition be mixed with a resin composition having salt-forming agents. Such a resin composition may be one of the type which has salt-forming groups and can be dissolved or dispersed in water by being neutralized. In this case, the positive-type photosensitive resin composition of the invention will prove very advantageous in that it has good emulsifiability and in that an aqueous dispersion thereof is unlikely to undergo settlement of its resin component with time and has good fluidity during a hot working stage. This permits easy repair of any pin hole which may develop in the deposited coat as a result of an electrode reaction due to heating and drying of the electrodeposited coat after the electrocoating process.

As resin compositions having salt-forming groups may be enumerated a system in which the resin composition having alkali-reactive groups contain a basic compound as a neutralizer, and a system in which the resin composition having basic groups contain an acid compound. However, naphthoquinone diazide compounds are liable to change of properties due to contact with a basic substance, and more particularly in a deposited coat after the electrocoating process, many of the basic groups have lost ion pairs with the neutralizer and regained basic characteristics. This will likely cause a thermal property change to the quinone diazide unit during the heating and drying stage following the electrocoating stage. Therefore, acid groups are preferred for use as salt-forming groups.

Preferred examples of such resin compositions are those of the alkali-soluble resin type having acid groups, such as calboxylic acid, sulfonic acid, and phosphoric acid groups, and those containing a basic compound as a neutralizer. More particularly, carboxyl acid groups are preferred as acid groups. Examples of preferred neutralizers are alkanolamines, such as monoethanolamine, diethanolamine, and triethanolamine; alkylamines, such as monoethylamine, diethylamine, and triethylamine; alkylalkanolamines, such as dimethylaminoethanol and the like; and alkali metal hydroxides, such as sodium hydroxide and potassium hydroxide. For the alkali-soluble resin skelton having alkali-reactive groups there is no particular limitation, but acrylic resin compositions are preferred for use as such.

Such acrylic resin composition is produced by polymerizing unsaturated monomers containing calboxylic acid groups with other $\alpha,\beta$-ethylenic unsaturated monomers which are polymerizable with them, according to known techniques. Examples of the unsaturated monomers are acrylic acid, methacrylic acid, crotonic acid, itaconic acid, maleic acid, fumaric acid, and those unsaturated monomers expressed in formulas (I) and (II) disclosed in U.S. Pat. No. 4,946,757. These unsaturated monomers containing alkali-reactive groups may be used alone or in combination. During the process of plymerization, such unsaturated monomers are used in a total proportion of 2 to 80% by weight relative to the acrylic resin composition. If the proportion is less than 2% by weight, the resulting composition lacks dispersion stability when it is used as an aqueous dispersion. Further, it has no good solubility and is therefore likely to cause defective development. If the proportion is more than 80% by weight, the composition lacks resistance to an alkaline developing solution with the result that even the printing area of the unexposed portion will be dissolved.

Examples of $\alpha,\beta$-ethylenic unsaturated monomer as aforesaid other copolymer components are (meth)acrylic esters, such as methyl (meta)acrylate, ethyl (meth)acrylate, n-butyl (meth)acrylate, i-butyl (meth)acrylate, tert-butyl (meth)acrylate, 2-ethylhexyl (meth)acrylate, and lauryl (meth)acrylate; polymerizable aromatic compounds, such as styrene and vinyltoluene; polymereizable amide compounds, such as (meth)acrylamide and diacetone acrylamide; polymerizable nitrile compounds, such as (meth)acrylonitrile and the like; and hydroxyl group-containing compounds, such as 2-hydroxyethyl (meth)acrylate, hydroxypropyl (meth)acrylate, and allyl alcohol. Also, unsaturated monomers having phenolic hydroxyl groups produced by reacting aromatic compounds having phenolic hydroxyl groups and carboxyl groups with unsaturated monomers having glycidyl groups which are described in U.S. Pat. No. 4,673,458 may be used. These monomers may be used alone or in combination. A suitable molecular weight range for the acrylic resin composition obtained in this way is 1,000 to 200,000, preferably 3,000 to 100,000 in terms of weight-average molecular weight. If the weight-average molecular weight is more than 200,000, the speed of dissolution of the composition in an aqueous solution of alkali is very low, so that longer time is required for development, which does not suit any practical purpose. On the other hand, if the weight-average molecular weight is less than 1,000, the solubility of the composition in such an aqueous solution is excessively high, and this will adversely affect the preservation of unexposed areas and will additionally cause pattern leaning.

The positive-type photosensitive resin composition of the present invention is used in a proportional range of 3 to 150 parts by weight relative to 100 parts by weight of such an acrylic resin composition. If the proportion is less than 3 parts by weight, the quantity of carboxylic acid development due to photolysis will be smaller, so that the advantage of the composition in respect of its solubility in the aqueous solution of alkali can hardly be exhibited. This leads to patterning difficulty. On the other hand, if the proportion is more than 150 parts by weight, most of the quinone diazide units of added positive type photosensitive groups will remain unchanged under any short-time exposure to light. In other words, nonsolubility effect of the quinone diazide units in the aqueous solution of alkali is unreasonably high, which naturally leads to development difficulty.

Dispersion or dissolution in water of the acrylic resin composition mixture containing the positive type photosensitive resin composition of the invention can be effected by neutralizing salt-forming groups present in the acrylic resin composition. The amount of the neutralizer to be used is preferably within an equivalent range of 0.1 to 1.0 relative to one equivalent of salt-forming group. If the amount is less than 0.2 equivalent, the stability of the aqueous dispersion is lower and precipitation will occur with time. On the other hand, if the amount is more than 1.0 equivalent, the stability of quinone diazide groups is lowered or the appearance of the coat deposited by electrocoating is deteriorated. Usually, aqueous dispersions or aqueous solutions are prepared in such a way that the resin composition having salt-forming groups, the positive-type photosensitive resin composition of the invention, and the neutralizer, and any other desired components including, for example, an organic solvent for adjustment of electrocoated coat thickness or thermal flow adjustment for the deposited coat, pigment, dye or the like for visible image formation, and/or a defoamer, a surface active agent, etc., are mixed together and diluted with water.

The positive-type photosensitive resin composition according to the invention can be electrocoated on any substrate having a conductive surface to form a coat thereon. It is particularly useful for application on copper substrates for printed circuit which have small through-holes therein, though it has hitherto been extremely difficult to apply electrodeposition. In carrying out electrocoating, an electrocoating bath in which the resin composition is contained is controlled to a solid content concentration of 3 to 40%, preferably 5 to 25%, and a bath temperature range of 10° to 40° C., preferably 10° to 35° C., and a substrate having a desired conductive surface is immersed in the bath. Then, a DC current is applied to salt-forming groups in the resin composition, with the salt-forming groups used as a counter electrode, until the desired coat thickness is obtained. In this way, electrocoating can be easily carried out.

After electrocoating, the object for coating is removed from the electrocoating bath and washed with water. Then, the coated object is heated and dried according to the conventional procedure, whereby the moisture and solvent remaining in the coat is removed. Thus, a positive-type photosensitive resin coat which is uniform and free of pin-hole is obtained. Heating and drying is carried out in a temperature range of 40° to 150° C., preferably 60° to 130° C. If the drying temperature is lower than 40° C., pin-holes which have occurred due to electrode reaction cannot be filled up even after prolonged drying. If the drying temperature is higher than 150° C., thermal property change of the quinone diazide groups would occur.

The photosensitive layer thus formed of the positive-type photosensitive resin composition is usually exposed to light through light projection through a positive pattern film, and exposed portions other than the portions which are used as conductor circuits are removed. Thus, the desired resist pattern is obtained.

The exposure light source to be used in the invention may be of any type having a wave length range of 300 to 450 nm. Specifically, lamps, such as a high-pressure mercury lamp, an extra-high pressure mercury lamp, a xenon discharge lamp, and an arc lamp, may be used.

Development can be easily performed using an aqueous solution of alkali according to the conventional procedure. Specifically, the immersion process, spray process, and brushing process are available for use, of which the spray process is especially preferred. Useful aqueous solutions of alkalis usually include, for example, aqueous solutions of inorganic alkalis, such as sodium carbonate, sodium silicate, sodium metasilicate, tribasic sodium phosphate, sodium hydroxide, and potassium hydroxide; aqueous solutions of organic amines, such as n-propylamine, di-n-propylamine, pyrrole, piperidine, triethylenediamine, dimethylethanolamine, triethanolamine, and triethylamine; aqueous solutions of quaternary ammonium salts, such as tetramethylammonium hydroxide and tetraethylammonium hydroxide; and ammonia water. Also, aqueous solutions comprising any of above named aqueous solutions of alkalis added with an organic solvent, a surfactant, and/or a defoamer in suitable proportions may be used as developing solutions.

Then, for the purpose of fabricating a printed circuit board, the copper surface exposed on the substrate as a result of the development treatment is etched by an acid etching solution, such as an aqueous solution of iron oxide or an aqueous solution of copper chloride, or an alkali etching liquid composed principally of copper-amine complex. In this case, if a photosensitive layer has already been formed by electrocoating, the interior of the small through-hole is completely protected from the etching liquid by virtue of the photosensitive layer. Then, any unexposed resist film on the conductor pattern and any resist film in the small through-hole are separated from the copper surface by an aqueous solution of strong alkali, such as sodium hydroxide or potassium hydroxide of high concentration. Thus, the desired copper circuit pattern is produced on the surface of the substrate.

The positive type photosensitive resin composition of the invention provides further improvement in the exposure sensitivity attained by the prior art system using a quinone diazide compound of the conventional type. It has high exposure sensitivity, provides good protection from any developing solution for unexposed portions during the stage of development, and inhibits such undesirable occurrences as swelling and dissolution. The composition presents a wide development latitude. Therefore, the composition of the invention is very useful for many industrial applications. When it is used as aqueous dispersions for electrocoating purposes, the composition provides good compatibility with resin compositions having salt-forming groups, and good storage stability. When, during the stage of electrocoating, an object for coating is immersed in a bath containing the composition of the invention, the composition can well follow any surface configuration wherever the surface is accessible for contact by the composition, to enable satisfactory coat deposition. Through subsequent heating and drying can be formed a uniform coat which is stickiness-free, smooth, and defect-free. Further, the photosensitive coat can form a minute resist pattern faithful to the original design drawing through the process of exposure and development. The heat sensitive resin composition is particularly useful for the fabrication of printed circuit boards which meet the current requirements for high dense packaging and multilayer formation. The use of the saturated or unsaturated monocarboxylic acid compound (C) effectively shortens developing time and a period of whole processing time is shortened.

EXAMPLES

The present invention is illustrated by the following Examples which, however, are not to be construed as limiting the invention to their details.

Photosensitive Material Synthesis Example 1

Into a glass-made reaction flask of 1 liter equipped with an agitator, a reflux tube, and a thermometer were introduced 105 parts by weight of trimethylol propane triglycidyl ether (epoxy equivalent 150), 48 parts by weight of o-hydroxybenzoic acid (50 mol % relative to total epoxy group), 43 parts by weight of benzoic acid (50 mol % relative to total epoxy group) and 66 parts by weight of dioxane respectively. The temperature was raised to 120° C. and 2.0 parts by weight of tetramethylammonium chloride was added as a catalyst. Thereafter, reaction was carried out for 5 hours. The acid value of the reaction solution was 6.0, and the rate of reaction was 94.6%.

Then, the contents were cooled to 10° C., and 75 parts by weight of 1,2-naphthoquinone diazide-5-sulfonyl chloride (80 mol % relative to the remaining OH groups), and 560 parts by weight of acetone were added. Thereafter, 31 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 18 hours, and thus a positive-type photosensitive resin was obtained. The yield was 95%.

Photosensitive Material Synthesis Example 2

Into a reaction vessel of the same construction as that in the photosensitive material synthesis example 1 were introduced 96 parts by weight of polyethylene glycol diglycidyl ether (epoxy equivalent 192.5), 55 parts by weight of o-hydroxybenzoic acid (80 mol % relative to total epoxy group), 18 parts by weight of p-t-butylbenzoic acid (20 mol % relative to total epoxy group) and 50 parts by weight of diethylene glycol dimethyl ether respectively. The temperature was raised to 120° C. and 1.7 parts by weight of tetramethylammonium chloride was added as a catalyst. Thereafter, reaction was carried out for 5 hours. The acid value of the reaction solution was 4.5, and the rate of reaction was 96.5%.

Then, the contents were cooled to 10° C., and 81 parts by weight of 1,2-naphthoquinone diazide-5-sulfonyl chloride (75 mol % relative to the remaining OH groups), and 510 parts by weight of acetone were added. Thereafter, 30 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 20 hours, and thus a positive-type photosensitive resin was obtained. The yield was 94%.

Photosensitive Material Synthesis example 3

Into a reaction vessel of the same construction as that in the photosensitive material synthesis example 1 were introduced 105 parts by weight of trimethylol propane triglycidyl ether (epoxy equivalent 150), 68 parts by weight of o-hydroxybenzoic acid (70 mol % relative to total epoxy group), 32 parts by weight of 3-phenylpropionic acid (30 mol % relative to total epoxy group) and 68 parts by weight of dioxane respectively. The temperature was raised to 120° C. and 2.0 parts by weight of tetramethylammonium chloride was added as a catalyst. Thereafter, reaction was carried out for 5 hours. The acid value of the reaction solution was 6.0, and the rate of reaction was 95.8%.

Then, the contents were cooled to 10° C., and 79 parts by weight of 1,2-naphthoquinone diazide-5-sulfonyl chloride (60 mol % relative to the remaining OH groups), and 565 parts by weight of acetone were added. Thereafter, 33 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 18 hours, and thus a positive-type photosensitive resin was obtained. The yield was 96%.

Photosensitive Material Synthesis Example 4

Into a glass-made reaction flask of 1 liter equipped with an agitator, a reflux tube, and a thermometer were introduced 105 parts by weight of trimethylol propane triglycidyl ether (epoxy equivalent 150), 60 parts by weight of o-hydroxybenzoic acid (60 mol % relative to total epoxy group), 21 parts by weight of propionic acid (40 mol % relative to total epoxy group) and 46 parts by weight of dioxane respectively. The temperature was raised to 120° C. and 1.8 parts by weight of tetramethylammonium chloride was added as a catalyst. Thereafter, reaction was carried out for 5 hours. The acid value of the reaction solution was 6.5, and the rate of reaction was 96.2%.

Then, the contents were cooled to 10° C., and 94 parts by weight of 1,2-naphthoquinone diazide-5-sulfonyl chloride (80 mol % relative to the remaining OH groups), and 570 parts by weight of acetone were added. Thereafter, 39 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 18 hours, and thus a positive-type photosensitive resin was obtained. The yield was 95%.

Photosensitive Material Synthesis Example 5

Into a reaction vessel of the same construction as that in the photosensitive material synthesis example 4 were introduced 126 parts by weight of polyethylene glycol diglycidyl ether (epoxy equivalent 192.5), 31 parts by weight of o-hydroxybenzoic acid (35 mol % relative to total epoxy group), 73 parts by weight of n-decanoic acid (65 mol % relative to total epoxy group) and 42 parts by weight of diethylene glycol dimethyl ether respectively. The temperature was raised to 120° C. and 2.3 parts by weight of tetramethylammonium chloride was added as a catalyst. Thereafter, reaction was carried out for 5 hours. The acid value of the reaction solution was 5.5, and the rate of reaction was 95.9%.

Then, the contents were cooled to 10° C., and 53 parts by weight of 1,2-naphthoquinone diazide-5-sulfonyl chloride (86 mol % relative to the remaining OH groups), and 600 parts by weight of acetone were added. Thereafter, 21 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 20 hours, and thus a positive-type photosensitive resin was obtained. The yield was 94%.

Photosensitive Material Synthesis example 6

Into a reaction vessel of the same construction as that in the photosensitive material synthesis example 4 were introduced 106 parts by weight of polyethyleneglycol diglycidyl ether (epoxy equivalent 192.5), 61 parts by weight of o-hydroxybenzoic acid (80 mol % relative to total epoxy group), 31 parts by weight of oleic acid (20 mol % relative to total epoxy group) and 50 parts by weight of dioxane respectively. The temperature was raised to 120° C. and 2.0 parts by weight of tetramethylammonium chloride was added as a catalyst. Thereafter, reaction was carried out for 5 hours. The acid value of the reaction solution was 6.0, and the rate of reaction was 95.1%.

Then, the contents were cooled to 10° C., and 89 parts by weight of 1,2-naphthoquinone diazide-5-sulfonyl chloride (75 mol % relative to the remaining OH groups), and 590 parts by weight of acetone were added. Thereafter, 37 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 18 hours, and thus a positive-type photosensitive resin was obtained. The yield was 96%.

Photosensitive Material Comparative Example 1

Into a reaction vessel of the same construction as that in the photosensitive material synthesis example 1 were introduced 75 parts by weight of trimethylolpropane triglycidyl ether (epoxy equivalent 150), 69 parts by weight of o-hydroxybenzoic acid (100 mol % relative to total epoxy group), and 48 parts by weight of dioxane respectively. The temperature was raised to 120° C. and 1.4 parts by weight of tetramethylammonium chloride were added as a catalyst. Thereafter, reaction was carried out for 5 hours. The acid value of the reaction solution was 6.6, and the rate of reaction was 95.5%.

Then, the contents were cooled to 10° C., and 81 parts by weight of 1,2-naphthoquinone diazide-5-sulfonyl chloride (60 mol % relative to the remaining OH groups), and 565 parts by weight of acetone were added. Thereafter, 33 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 18 hours, and thus a positive-type photosensitive resin was obtained. The yield was 95%.

Photosensitive Material Comparative Example 2

Into a reaction vessel of the same construction as that in the photosensitive material synthesis example 1 were introduced 96 parts by weight of polyethylene glycol diglycidyl ether (epoxy equivalent 192.5), 69 parts by weight of o-hydroxybenzoic acid (100 mol % relative to total epoxy group), and 50 parts by weight of diethylene glycol dimethyl ether respectively. The temperature was raised to 120° C. and 1.7 parts by weight of tetramethylammonium chloride were added as a catalyst. Thereafter, reaction was carried out for 5 hours. The acid value of the reaction solution was 5.9, and the rate of reaction was 95.5%.

Then, the contents were cooled to 10° C., and 121 parts by weight of 1,2-naphthoquinone diazide-5-sulfonyl chloride (90 mol % relative to the remaining OH groups), and 570 parts by weight of acetone were added. Thereafter, 46 parts by weight of triethylamine was added dropwise as a catalyst, and reaction was carried out at 10° C. for 2 hours. The resulting reaction product was added dropwise into a large amount of aqueous solution of 2 wt % dilute hydrochloric acid and was allowed to precipitate. After washing with water, the precipitate was subjected to vacuum drying at 40° C. for 20 hours, and thus a positive-type photosensitive resin was obtained. The yield was 95%.

Resin Synthesis Example

Into a glass-made reaction flask of 1 liter equipped with an agitator, a reflux tube, a thermometer, and an air inlet pipe were introduced 77 parts by weight of trimellitic anhydride, 300 parts by weight of Blackcell FM-5 (a 5:1 mol adduct of ε-caprolacton and 2-hydroxyethyl methacrylate; Daicel Chemical Industries, Ltd.), and 500 ppm of hydroxyquinone monomethyl ether (relative to the total stock). Then, reaction was carried out by raising the internal temperature to 165° C. under air supply and stirring the contents for 30 minutes. After completion of the reaction, the resulting reaction product was filtered and a small amount of unreacted material was removed. This intermediate synthesis product was a semi-solid material (25° C.) having an acid value of 125.

Subsequently, the immediate synthesis product thus obtained was loaded with 100 parts by weight of "Carjura E", and the mixture was agitated at 150° C. under air supply for 40 minutes, whereby reaction was carried out.

The reaction product thus obtained or a reactive acrylic monomer (A) had an acid value of 52 and a viscosity of 400 cP (25° C.). The rate of reaction was 95%.

Nextly, after 328 parts by weight of ethylene glycol monobutyl ether were charged into a glass-made reaction flask equipped with an agitator, a reflux tube, a thermometer, a dropping funnel, and a nitrogen introduction pipe, a solution prepared by mixing 154 parts by weight of the reactive acrylic monomer (A), 14.4 parts by weight of methacrylic acid, 158 parts by weight of methyl methacrylate, 73.2 parts by weight of n-butyl acrylate, and 10.6 parts by weight of t-butylperoxy-2-ethyl hexanoate, was allowed to drop under stirring at 120° C. for three hours. An acrylic resin composition having a solid content=55.0 wt % was thus obtained. The reaction product resin had a weight average molecular weight of 26,000 and an acid value of 43.5.

Example 1

A photosensitive liquid comprising 5 parts by weight of the positive type photosensitive resin produced in the Photosensitive Material Synthesis Example 1 which was dissolved in 50 parts by weight of methyl ethyl ketone was coated on a double-side circuit substrate for a printed circuit board having a copper thickness of 35μ. Then, by using a dryer, drying was effected at 80° C. for 10 minutes. Thus, a positive type photosensitive resin film having a film thickness of 1.5μ was obtained.

(1) Exposure sensitivity test

A positive film having a circuit pattern, together with a stoffer step tablet, was placed on the resin film obtained in the above described way for intimate contact therewith, and was subjected to exposure within an exposure range of from 0 mJ/cm² (unexposed) to 600 mJ/cm² at the film surface in units of 20 mJ/cm², by using a HMW-201B exposure apparatus (Ohk Seisakusho). Spray development (spray pressure=1 kgf/cm² was carried out with a 1% aqueous solution of sodium metasilicate at 30° C. for 30 minutes. A minimum exposure quantity available for development and considered necessary for circuit pattern preparation was examined. Also, a minimum number of stoffer steps remaining after development of the resin film subjected to an exposure quantity of 400 mJ/cm² was checked.

(2) Test on resistance of unexposed area to the developing solution

Resin coating was applied to a double-side substrate for a printed wiring circuit board having a copper thickness of 35 μm, the weight of which had previously been measured ($W_0$), according to the above described method, and after coat application the weight of the substrate was again measured ($W_1$). The resin coat applied was subjected to spray development with a 1% aqueous solution of sodium metasilicate at 30° C. for 90 seconds. Thereafter drying was effected in a dryer at 100° C. for 2 minutes. After cooling, weight measurement was made ($W_2$). Then, according to the following formula, the residual film ratio after development was calculated with respect to the resin film.

Residual film ratio (wt %)=$(W_2-W_0)/(W_1-W_0) \times 100$

Results of the evaluation are shown in Table 1. The subject resin film using the photosensitive material produced in the synthesis example 1 showed improved exposure sensitivity as compared with the comparative example 1. Further, any such occurrence as decreased resistance of the unexposed area to the developing solution which was noticed in the case of Comparative Example 2 was not observed.

Examples 2–4, Comparative Examples 1, 2

Except that the developing solution was a 1% aqueous solution of sodium carbonate, performance evaluation was made in same way as in Example 1, with film thickness uniformly set at 5 μm. Photosensitive liquid composition and evaluation results are shown in Table 1.

Example 5

A photosensitive liquid comprising 5 parts by weight of the positive type photosensitive resin produced in the Photosensitive Material Synthesis Example 4 which was dissolved in 50 parts by weight of methyl ethyl ketone was coated on a double-side circuit substrate for a printed circuit board having a copper thickness of 35μ. Then, by using a dryer, drying was effected at 80° C. for 10 minutes. Thus, a positive type photosensitive resin film having a film thickness of 1.5μ was obtained.

(4) Exposure sensitivity test

A positive film having a circuit pattern, together with a stoffer step tablet, was placed on the resin film obtained in the above described way for intimate contact therewith, and was subjected to exposure within an exposure range of from 0 mJ/cm² (unexposed) to 600 mJ/cm² at the film surface in units of 20 mJ/cm², by using a HEW-201B exposure apparatus (Ohk Seisakusho). Spray development (spray pressure=1 kgf/cm² was carried out with a 1% aqueous solution of sodium metasilicate at 30° C. for 30 minutes. A minimum exposure quantity available for development and considered necessary for circuit pattern preparation was examined. Also, a minimum number of stoffer steps remaining after development of the resin film subjected to an exposure quantity of 200 mJ/cm² and 400 mJ/cm² was checked.

(5) Determination of shortest developing time

The resin coating which was exposed in an exposing amount of 200 mJ/cm² and 400 mJ/cm² as described in the above step (4) was developed with a 1% aqeous solution of sodium metasilicate at 30° C. The exposed copper surface was etching with a solution of ferric chloride at 40° C. A shortest time for developing was determined by conducting the above mentioned process until a faithful circuit pattern was obtained without remaining copper on the exposed portion.

(6) Test on resistance of unexposed area to the developing solution coducted as described in Example 1.

Results of the evaluation are shown in Table 2. The subject resin film using the photosensitive material produced in the synthesis example 4 showed improved exposure sensitivity and shortened developing time as compared with the comparative example 1. Further, any such occurrence as decreased resistance of the unexposed area to the developing solution which was noticed in the case of Comparative Example 2 was not observed.

Examples 6–8, Comparative Examples 1, 2

Except that the developing solution was a 1% aqueous solution of sodium carbonate, performance evaluation was made in same way as in Example 5, with film thickness uniformly set at 5 μm. Photosensitive liquid composition and evaluation results are shown in Table 2.

Example 9 (Evaluation as Electrocoating Composition)

To 100 parts by weight of a resin varnish produced in the resin synthesis was added a solution in which 13.8 parts by weight of the positive-type photosensitive resin produced in the photosensitive material synthesis example 1 was dissolved in 25 parts by weight of propylene glycol monomethyl ether. Further, 3.5 parts by weight of trimethylamine were added to the mixture to dissolve same. 550 parts by weight of deionized water was added gradually under stirring, and an electrocoating composition was thus obtained. This electrocoating liquid was placed in a glass-made vessel and was allowed to stand at 20° for one week. The electrocoating liquid was found as having excellent stability against emulsification.

Then, a double-side printed circuit board having a through-hole of 0.3 mm dia and a copper thickness of 35 μm was immersed in the electrocoating composition, and a positive electrode was connected to the board and a negative electrode was connected to the metal vessel in which the electrocoating composition was placed. Electricity was applied in a current density of 50 mA/dm$^2$ at 25° C. for 2 minutes. Subsequently, the board was removed from the bath and washed in water. Drying was effected in an oven at 100° C. for 5 minutes. Thus, a positive-type photosensitive resin coating of 7 μm was formed. A visual appearance check witnessed that this resin coating was pinhole-free and uniform, and that the interior of the pinhole was completely covered.

Nextly, except that the developing solution was a 1% aqueous solution of sodium carbonate, performance evaluation was carried out in the same way as in Example 1. The results are shown in Table 3.

Examples 10-11, Comparative Example 3 (Evaluation as electrocoating composition)

Performance evaluation was made with respect to electrocoating solution and resin coat in the same way as in Example 9 and with coat thickness uniformly set at 7 μm.

Example 12 (Evaluation as Electrocoating Composition)

To 100 parts by weight of a resin varnish produced in the resin synthesis was added a solution in which 23.6 parts by weight of the positive-type photosensitive resin produced in the photosensitive material synthesis example 4 was dissolved in 24 parts by weight of propylene glycol monomethyl ether. Further, 3.4 parts by weight of trimethylamine was added to the mixture to dissolve same. 635 parts by weight of deionized water was added gradually under stirring, and an electrocoating composition was thus obtained. This electrocoating liquid was placed in a glass-made vessel and was allowed to stand at 20° for one week. The electrocoating liquid was found as having excellent stability against emulsification.

Then, a double-side printed circuit board having a through-hole of 0.3 mm dia and a copper thickness of 35 μm was immersed in the electrocoating composition, and a positive electrode was connected to the board and a negative electrode was connected to the metal vessel in which the electrocoating composition was placed. Electricity was applied in a current density of 50 mA/dm$^2$ at 25° C. for 2 minutes. Subsequently, the board was removed from the bath and washed in water. Drying was effected in an oven at 100° C. for 5 minutes. Thus, a positive-type photosensitive resin coating of 7 μm was formed. A visual appearance check witnessed that this resin coating was pinhole-free and uniform, and that the interior of the pinhole was completely covered.

Nextly, except that the developing solution was a 1% aqueous solution of sodium carbonate, performance evaluation was carried out in the same way as in Example 5. The results are shown in Table 4.

Examples 13-14, Comparative Example 3 (Evaluation as electrocoating composition)

Performance evaluation was made with respect to electrocoating solution and resin coat in the same way as in Example 12 and with coat thickness uniformly set at 7 μm.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

TABLE 1

|  | Example 1 | Example 2 | Example 3 | Example 4 | Comp. Ex. 1 | Comp. Ex. 2 |
|---|---|---|---|---|---|---|
| Liquid Composition in wt parts |  |  |  |  |  |  |
| Photosensitive material synthesis 1 | 5 | 5 |  |  |  |  |
| Photosensitive material synthesis 2 |  |  | 5 |  |  |  |
| Photosensitive material synthesis 3 |  |  |  | 5 |  |  |
| Photosensitive material comparative example 1 |  |  |  |  | 5 |  |
| Photosensitive material comparative example 2 |  |  |  |  |  | 2 |
| Resin synthesis example |  | 36 | 36 | 36 | 36 | 36 |
| methyl ethyl ketone | 50 | 10 | 10 | 10 | 10 | 10 |
| Developable minimum exposure (mJ/cm$^2$) | 100 | 140 | 120 | 140 | 120 | 260 |
| Remaining min. Stoffer step No. | 6 | 5 | 6 | 6 | 6 | 3 |
| Residual film ratio/90 sec develop. | 99.2 | 99.5 | 99.2 | 99.4 | 60.5 | 99.4 |
| Exposure sensitivity/resistance to developing solution compatibility | Excellent | Good | Good | Good | Fair | Fair |

TABLE 2

|  | Example 5 | Example 6 | Example 7 | Example 8 | Comp. Ex. 1 | Comp. Ex. 2 |
|---|---|---|---|---|---|---|
| Liquid Composition in wt parts |  |  |  |  |  |  |
| Photosensitive material synthesis 4 | 5 | 5 |  |  |  |  |
| Photosensitive material synthesis 5 |  |  | 5 |  |  |  |
| Photosensitive material synthesis 6 |  |  |  | 5 |  |  |
| Photosensitive material |  |  |  |  | 5 |  |

TABLE 2-continued

|  | Example 5 | Example 6 | Example 7 | Example 8 | Comp. Ex. 1 | Comp. Ex. 2 |
|---|---|---|---|---|---|---|
| comparative example 1 Photosensitive material |  |  |  |  |  | 2 |
| comparative example 2 Resin synthesis example |  | 36 | 36 | 36 | 36 | 36 |
| methyl ethyl ketone | 50 | 10 | 10 | 10 | 10 | 10 |
| Developable minimum exposure (mJ/cm$^2$) | 100 | 140 | 120 | 140 | 120 | 260 |
| Remaining min. Stoffer step No. |  |  |  |  |  |  |
| 200 mJ/cm$^2$ | 2 | 2 | 3 | 2 | 3 | 1 |
| 400 mJ/cm$^2$ | 5 | 6 | 6 | 5 | 6 | 3 |
| Shortest developing time (sec) |  |  |  |  |  |  |
| 200 mJ/cm$^2$ | 20 | 30 | 35 | 40 | 30 | Impossible |
| 400 mJ/cm$^2$ | 20 | 30 | 30 | 35 | 30 | 50 |
| Residual film ratio/90 sec develop. | 99.1 | 98.5 | 99.0 | 99.5 | 60.5 | 99.4 |
| Exposure sensitivity/resistance to developing solution compatibility | Excellent | Good | Good | Good | Fair | Fair |

TABLE 3

|  | Example 9 | Example 10 | Example 11 | Comp. Ex. 3 |
|---|---|---|---|---|
| Electrocoating liquid in wt parts |  |  |  |  |
| Photosensitive material synthesis 1 | 13.8 |  |  |  |
| Photosensitive material synthesis 2 |  | 7.1 |  |  |
| Photosensitive material synthesis 3 |  |  | 8.2 |  |
| Photosensitive material comparative example 1 |  |  |  | 6.4 |
| Resin synthesis example | 100 | 100 | 100 | 100 |
| Propylene glycol/methyl ether | 25 | 13 | 15 | 12 |
| Triethylamine | 3.5 | 3.5 | 3.5 | 3.5 |
| Deionized water | 550 | 500 | 510 | 490 |
| Stability against emulsification | Nil | Nil | Nil | Yes |
| Developable min. exposure (mj/cm$^2$) | 160 | 160 | 140 | 140 |
| Remaining min. Stoffer step no. | 6 | 5 | 6 | 6 |
| Residual film ratio/90 sec develop. (wt %) | 99.6 | 99.5 | 99.3 | 62.0 |
| Exposure sensitivity/resistance to developing solution compatibility | Good | Good | Excellent | Fair |

TABLE 4

|  | Example 12 | Example 13 | Example 14 | Comp. Ex. 3 |
|---|---|---|---|---|
| Electrocoating liquid in wt parts |  |  |  |  |
| Photosensitive material synthesis 4 | 23.6 |  |  |  |
| Photosensitive material synthesis 5 |  | 29.6 |  |  |
| Photosensitive material synthesis 6 |  |  | 13.8 |  |
| Photosensitive material comparative example 1 |  |  |  | 23.6 |
| Resin synthesis example | 100 | 100 | 100 | 100 |
| Propylene glycol/methyl ether | 24 | 30 | 14 | 24 |
| Triethylamine | 3.4 | 3.7 | 3.0 | 3.4 |
| Deionized water | 635 | 680 | 570 | 635 |
| Stability against emulsification | Nil | Nil | Nil | Yes |
| Developable min. exposure (mJ/cm$^2$) | 140 | 140 | 160 | 140 |
| Remaining min. Stoffer step no. |  |  |  |  |
| 200 mJ/cm$^2$ | 2 | 3 | 2 | 2 |
| 400 mJ/cm$^2$ | 6 | 6 | 5 | 6 |
| Shortest developing time (sec) |  |  |  |  |
| 200 mJ/cm$^2$ | 35 | 35 | 40 | 30 |
| 400 mJ/cm$^2$ | 30 | 35 | 35 | 30 |
| Residual film ratio/90 sec develop. (wt %) | 98.9 | 99.1 | 98.4 | 60.1 |
| Exposure sensitivity/resistance to developing solution compatibility | Excellent | Good | Good | Fair |

What is claimed is:

1. A positive type photosensitive resin composition comprising a reaction product of the following four components:

(A) at least one kind of polyepoxide compound having an epoxy equivalent of 75 to 1000 selected from the group consisting of glycidyl ether compounds of polyhydroxy alcohol, glycidyl ester compounds of polycarboxylic acid, alicyclic glycidyl compounds, glycidyl amine compounds, heterocyclic glycidyl compounds, and alkylene oxide compounds of bisphenol A;

(B) an aromatic or heterocyclic carboxylic acid compound having a phenolic hydroxyl group expressed by the general formula (I):

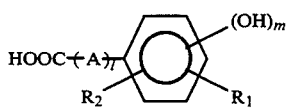

(in which A represents an alkylene or arylene which may have a substituent, or —CH=CH—, —CO—R$_3$—, —CO—O—R$_4$—, —CO—CH$_2$NH—, where R$_3$, R$_4$ represent an alkylene or arylene group which may have a substituent; l represents 0 or 1; m represents an integer of 1 to 3; R$_1$, R$_2$ may be same or different and represent a hydrogen atom, a halogen atom, an alkyl group, an alkenyl group, a nitrile group, or an alkoxy group; and R$_1$, R$_2$, together with the carbon atom of a benzene ring, may form an aromatic ring, an alicyclic ring, or a heterocyclic ring);

(C) either an aromatic or heterocyclic carboxylic acid compound having no phenolic hydroxyl group which is expressed by the general formula (II):

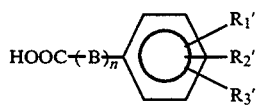

(in which B represents an alkylene or arylene which may have a substituent, or —CH=CH—, —CO—R'$_4$—, —CO—R'$_5$—, —CO—CH$_2$NH—, where R'$_4$, R'$_5$ represent an alkylene or arylene group which may have a substituent; n represents 0 or 1; R'$_1$, R'$_2$, R'$_3$ may be same or different and represent a hydrogen atom, a halogen atom, an alkyl group, an alkenyl group, a nitrile group, or an alkoxy group; and R'$_1$, R'$_2$, R'$_3$, together with adjacent substituents and the carbon atom of a benzene ring, may form an aromatic ring, an alicyclic ring, or a heterocyclic ring), or a suturated or unsaturated aliphatic monocarboxylic acid compound represented by the general formula (III):

R$_1''$—COOH (in which R$_1''$ represents an aklyl, alkenyl or alkoxy group which may have a substituent, a hydrogen atom, R$_2''$—O—CO—R$_3''$—, R$_4''$—NH—CO—R$_5''$—, where R$_2''$ and R$_4''$ represent an alkyl, alkenyl or monoalkoxyalkyl group which may have a substituent, and R$_3''$ and R$_5''$ represent an alkylene, alkylene ether or —CH=CH— which may have a substituent) or the both; and (D) 1,2-quinone diazide sulfonyl halide; wherein the ratio of (B) to (C), both carboxylic acid components, is such that the proportion of (C) is 10% at minimum and 95% at maximum in terms of carboxyl group equivalent, and the ratio of (B)+(C) carboxyl group: (A) epoxy equivalent=1:0.8 to 1.2, and wherein as a result of the reaction between the phenolic hydroxyl group of (B) and the sulfonyl halide of (D), the number of unreacted phenolic OH groups remaining in one molecule is equivalent to 0 to 75% of the number of phenolic OH groups present in one molecule prior to the reaction.

2. A positive-type photosensitive electrocoating liquid comprising an aqueous solution or dispersion which contains a resin composition having a salt forming group, a neutralizer for neutralizing the group, and a positive-type photosensitive resin composition as set forth in claim 1.

3. A positive-type photosensitive electrocoating liquid as set forth in claim 2, wherein the salt forming group is an acidic group and the neutralizer is a basic compound.

* * * * *